US008653360B2

(12) United States Patent
Bedell et al.

(10) Patent No.: US 8,653,360 B2
(45) Date of Patent: Feb. 18, 2014

(54) COMPOSITIONALLY-GRADED BAND GAP HETEROJUNCTION SOLAR CELL

(75) Inventors: Stephen W. Bedell, Wappingers Falls, NY (US); Harold J. Hovel, Katonah, NY (US); Daniel A. Inns, Palo Alto, CA (US); Jee H. Kim, Los Angeles, CA (US); Alexander Reznicek, Mount Kisco, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 386 days.

(21) Appl. No.: 12/849,966

(22) Filed: Aug. 4, 2010

(65) Prior Publication Data

US 2012/0031476 A1    Feb. 9, 2012

(51) Int. Cl.
*H01L 31/00* (2006.01)
*H01L 21/00* (2006.01)

(52) U.S. Cl.
USPC .............................. 136/255; 136/261; 438/87

(58) Field of Classification Search
CPC ..................................................... H01L 31/028
USPC ....................................... 136/255, 261; 438/87
See application file for complete search history.

(56) References Cited

U.S. PATENT DOCUMENTS

| | | | | |
|---|---|---|---|---|
| 5,204,272 | A | * | 4/1993 | Guha et al. .................... 438/96 |
| 5,252,142 | A | * | 10/1993 | Matsuyama et al. .......... 136/255 |
| 6,100,465 | A | * | 8/2000 | Shinohara et al. ............ 136/258 |
| 6,670,544 | B2 | | 12/2003 | Kibbel et al. |
| 7,199,303 | B2 | | 4/2007 | Machida et al. |
| 7,279,632 | B2 | | 10/2007 | Nakajima et al. |
| 2003/0015234 | A1 | * | 1/2003 | Yasuno ......................... 136/249 |
| 2008/0111162 | A1 | * | 5/2008 | Yang et al. .................... 257/255 |

FOREIGN PATENT DOCUMENTS

JP        63143677 A      6/1988

OTHER PUBLICATIONS

Bennett, M.S. et al., "Improved Stability in Amorphous Silicon Germanium Solar Cells Made From Hydrogen-Diluted Silane and Germane" IEEE (1990) pp. 1653-1655, vol. 2.

\* cited by examiner

*Primary Examiner* — Eli Mekhlin
(74) *Attorney, Agent, or Firm* — Scully, Scott, Murphy & Presser, P.C.; Louis J. Percello, Esq.

(57) ABSTRACT

A photovoltaic device includes a composition modulated semiconductor structure including a p-doped first semiconductor material layer, a first intrinsic compositionally-graded semiconductor material layer, an intrinsic semiconductor material layer, a second intrinsic compositionally-graded semiconductor layer, and an n-doped first semiconductor material layer. The first and second intrinsic compositionally-graded semiconductor material layers include an alloy of a first semiconductor material having a greater band gap width and a second semiconductor material having a smaller band gap with, and the concentration of the second semiconductor material increases toward the intrinsic semiconductor material layer in the first and second compositionally-graded semiconductor material layers. The photovoltaic device provides an open circuit voltage comparable to that of the first semiconductor material, and a short circuit current comparable to that of the second semiconductor material, thereby increasing the efficiency of the photovoltaic device.

20 Claims, 12 Drawing Sheets

COMPOSITIONALLY-GRADED BAND GAP HETEROJUNCTION SOLAR CELL

BACKGROUND

The present disclosure relates to photovoltaic devices, and more particularly to photovoltaic devices including a compositionally-graded band gap heterojunction and methods of forming the same.

A photovoltaic device is a device that converts the energy of incident photons to electromotive force (e.m.f.). Typical photovoltaic devices include solar cells, which are configured to convert the energy in the electromagnetic radiation from the Sun to electric energy. Each photon has an energy given by the formula E=hν, in which the energy E is equal to the product of the Plank constant h and the frequency ν of the electromagnetic radiation associated with the photon.

Referring to FIG. 1, the functionality of a photovoltaic device can be approximated by an equivalent circuit that includes a current source, a diode, and two resistors. The circuit of FIG. 1 approximates a unit area of a physical photovoltaic device, which provides electrical current that is proportional to the total irradiated area of the physical photovoltaic device. The photovoltaic current per unit area generated by the physical photovoltaic device is referred to as a short-circuit current density $J_{sc}$, i.e., the current density generated by the physical photovoltaic device if the positive node and the negative node of the physical photovoltaic device are electrically shorted. Thus, the current source in FIG. 1 generates an electrical current with a current density of the short-circuit current density $J_{sc}$.

Power dissipation through internal leakage current is approximated by a shunt resistance $R_{sh}$. A finite value for the shunt resistance $R_{sh}$ triggers an internal leakage current through a physical photovoltaic device, and degrades the performance of the physical photovoltaic device. The lesser the shunt resistance $R_{sh}$, the greater is the internal power loss due to the internal leakage current.

Power dissipation through internal resistance of the physical photovoltaic device is approximated by a series resistance $R_s$. A non-zero value for the series resistance $R_s$ triggers Joule loss within the physical photovoltaic device. The greater the series resistance $R_s$, the greater is the internal power loss due to the internal resistance of the physical photovoltaic device.

The potential difference between the positive node and the negative node of a photovoltaic device generates an internal current that flows in the opposite direction to the photocurrent, i.e., the current represented by the current source having the short-circuit current density $J_{sc}$. The dark current has the same functional dependence on the voltage across the current source as a diode current. Thus, the dark current is approximated by a diode that allows a reverse-direction current. The density of the dark current, i.e., the dark current per unit area of the physical photovoltaic device, is referred to as the dark current density $J_{dark}$. An external load can be attached to an outer node of the series resistor and one of the nodes of the current source. In FIG. 1, the value the impedance of the load is the value of the actual impedance of a physical load is divided by the area of the physical photovoltaic cell because the equivalent circuit of FIG. 1 describes the functionality of a unit area of the physical photovoltaic cell.

Referring to FIG. 2, a schematic graph of an I-V curve of a physical photovoltaic device structure is shown. The bias voltage V is the voltage across the load in the equivalent circuit of FIG. 1. The open circuit voltage Voc corresponds to the voltage across the load as the resistance of the load diverges to infinity, i.e., the voltage across the current source when the load is disconnected. The inverse of the absolute value of the slope of the I-V curve at V=0 and $J=J_{sc}$ is approximately equal to the value of the shunt resistance $R_{sh}$. The inverse of the absolute value of the slope of the I-V curve at $V=V_{oc}$ and J=0 is approximately equal to the value of the series resistance $R_s$. The effect of the dark current is shown as an exponential decrease in the current density J as a function of the bias voltage V around a non-zero value of the bias voltage.

The operating range of a photovoltaic device is the portion of the I-V curve in the first quadrant, i.e., when both the bias voltage V and the current density J are positive. The power density P, i.e., the density of power generated from an unit area of the physical photovoltaic device of FIG. 1, is proportional to the product of the voltage V and the current density J along the I-V curve. The power density P reaches a maximum at a maximum power point of the I-V curve, which has the bias voltage of $V_m$ and the current density of $J_m$. The fill factor FF is defined by the following formula:

$$FF = \frac{J_m \times V_m}{J_{sc} \times V_{oc}}. \quad \text{(Eq. 1)}$$

The fill factor FF defines the degree by which the I-V curve of FIG. 3 approximates a rectangle. The fill factor FF is affected by the series resistance $R_s$ and the shunt resistance $R_{sh}$. The smaller the series resistance $R_s$, the greater the fill factor FF. The greater the shunt resistance $R_{sh}$, the greater the fill factor FF. The theoretical maximum for the fill factor is 1.0.

The efficiency η of a photovoltaic device is the ratio of the power density at the maximum power point to the incident light power density $P_s$. In other words, the efficiency η is given by:

$$\eta = \frac{J_m \times V_m}{P_s}. \quad \text{(Eq. 2)}$$

Eq. 2 can be rewritten as:

$$\eta = \frac{J_{sc} \times V_{oc} \times FF}{P_s}. \quad \text{(Eq. 3)}$$

Thus, the efficiency h of a photovoltaic device is proportional to the short circuit current density $J_{sc}$, the open circuit voltage $V_{oc}$, and the fill factor FF.

The efficiency η of a photovoltaic device depends on the spectral composition of the incident light. For solar cells, the efficiency is calculated under a standard radiation condition defined as 1 sun, which employs the spectrum of the sunlight.

As Eq. 3 indicates, the efficiency η of a photovoltaic device is proportional to the product of the short circuit current density $J_{sc}$ and the open circuit voltage $V_{oc}$. In order to enhance the efficiency η of a photovoltaic device, therefore, it is necessary to increase the product of the short circuit current density $J_{sc}$ and the open circuit voltage $V_{oc}$.

BRIEF SUMMARY

A photovoltaic device includes a composition modulated semiconductor structure, which includes a p-doped first semiconductor material layer, a first intrinsic compositionally-graded semiconductor material layer, an intrinsic semiconductor material layer, a second intrinsic compositionally-graded semiconductor layer, and an n-doped first semiconductor material layer. Each of the first and second intrinsic compositionally-graded semiconductor material layers includes an alloy of a first semiconductor material having a greater band gap width and a second semiconductor material having a smaller band gap with, and the concentration of the second semiconductor material increases towards the intrinsic semiconductor material layer in the first and second intrinsic compositionally-graded semiconductor material layers. The photovoltaic device provides an open circuit voltage comparable to that of the first semiconductor material, and a short circuit current comparable to that of the second semiconductor material, thereby increasing the efficiency of the photovoltaic device.

In one aspect, a photovoltaic device is provided, which includes a stack, from top to bottom, of a first intrinsic compositionally-graded semiconductor layer including a first compositionally-graded alloy of a first semiconductor material and a second semiconductor material, an intrinsic semiconductor material layer including at least the second semiconductor material, and an second intrinsic compositionally-graded semiconductor layer including a second compositionally-graded alloy of the first semiconductor material and the second semiconductor material, wherein an atomic concentration of the second semiconductor material monotonically decreases with distance from an interface with the intrinsic semiconductor layer in the first compositionally-graded alloy and the second compositionally-graded alloy.

In another aspect, a method of forming a photovoltaic device is provided. The method includes: forming a first intrinsic compositionally-graded semiconductor layer on a substrate, the first intrinsic compositionally-graded semiconductor layer including a first compositionally-graded alloy of a first semiconductor material and a second semiconductor material; forming an intrinsic semiconductor material layer on the first intrinsic compositionally-graded semiconductor layer, the intrinsic semiconductor material layer including at least the second semiconductor material; and forming a second intrinsic compositionally-graded semiconductor layer on the intrinsic semiconductor material layer, the second intrinsic compositionally-graded semiconductor layer including a second compositionally-graded alloy of the first semiconductor material and the second semiconductor material. An atomic concentration of the second semiconductor material monotonically decreases, and may strictly decrease, with distance from an interface with the intrinsic semiconductor layer in the first compositionally-graded alloy and the second compositionally-graded alloy, and the second conductivity type is the opposite of the first conductivity type.

BRIEF DESCRIPTION OF THE SEVERAL VIEWS OF THE DRAWINGS

FIG. 9 is a vertical cross-sectional view of an exemplary semiconductor structure including a first intrinsic compositionally-graded semiconductor layer including a compositionally-graded composition of a first semiconductor material and a second semiconductor material and having a doping of a first conductivity type, a second intrinsic compositionally-graded semiconductor layer including a compositionally-graded composition of the first semiconductor material and the second semiconductor material and having a doping of a second conductivity type which is the opposite of the first conductivity type, and an intrinsic second semiconductor layer in between.

DETAILED DESCRIPTION

Figure 1:
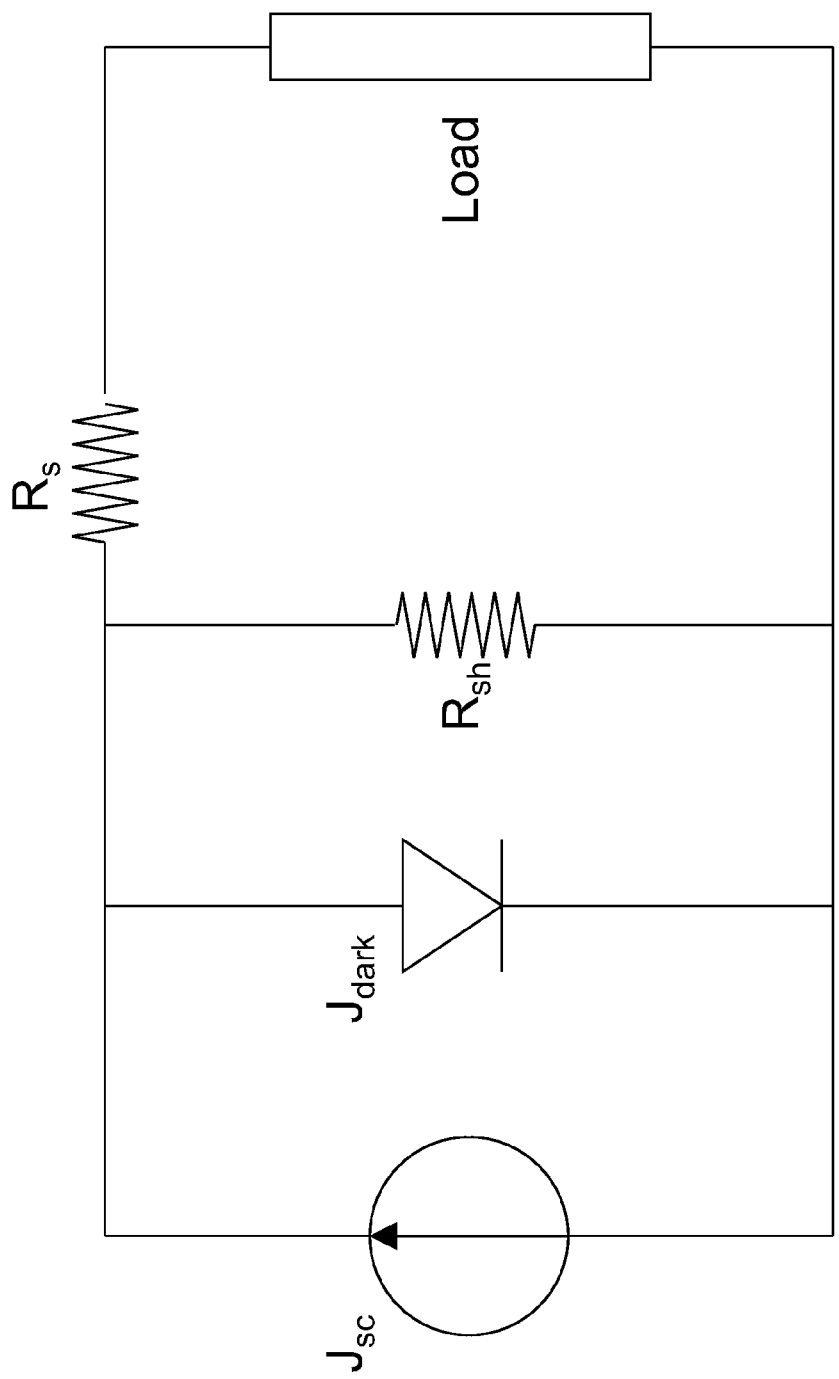
FIG. 1 is an equivalent circuit for a prior art photovoltaic device structure.
Figure 2:
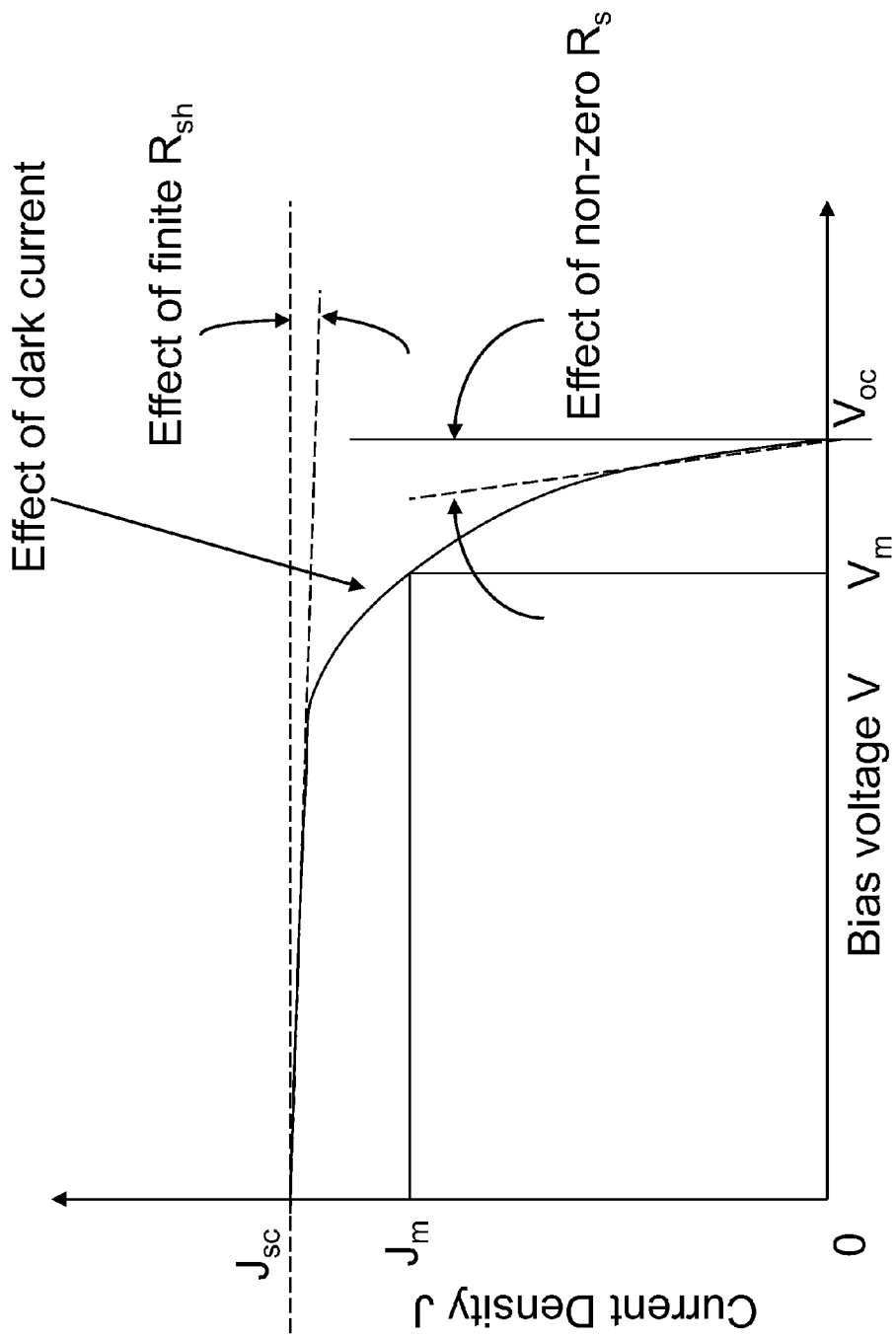
FIG. 2 is a schematic graph of an I-V curve of a prior art photovoltaic device structure.

As stated above, the present disclosure relates to photovoltaic devices including a compositionally-graded band gap heterojunction and methods of forming the same, which are now described in detail with accompanying figures. Throughout the drawings, the same reference numerals or letters are used to designate like or equivalent elements. The drawings are not necessarily drawn to scale. It is noted that a stack, from top to bottom, of elements can be rotated to become a stack, from bottom to top, of the same elements or a lateral stack, from one side to another side, of the same elements.

As used herein, a crystal structure is "microcrystalline" if the average grain size of the material is from 1 nm to 10 microns.

As used herein, a "hydrogenated" semiconductor material is a semiconductor material including incorporated hydrogen therein, which neutralizes dangling bonds in the semiconductor material and allows charge carriers to flow more freely.

As used herein, a "semiconductor material" refers to a material having a resistivity from $10^{-3}$ Ohm-cm to $10^8$ Ohm-cm, and includes elemental and compound semiconductor materials.

As used herein, an element is "optically transparent" if the element is transparent in the visible electromagnetic spectral range having a wavelength from 400 nm to 800 nm.

As used herein, a quantity is "monotonically increasing" if said quantity remains the same or increases with any positive change in an underlying parameter, such as a distance from a particular point. In this case, said quantity is a monotonically increasing function of said underlying parameter in general mathematical terms.

As used herein, a quantity is "monotonically decreasing" if said quantity remains the same or decreases with any positive change in an underlying parameter, such as a distance from a particular point. In this case, said quantity is a monotonically decreasing function of said underlying parameter in general mathematical terms.

As used herein, a quantity is "strictly increasing" if said quantity increases with any positive change in an underlying parameter, such as a distance from a particular point. In this case, said quantity is a strictly increasing function of said underlying parameter in general mathematical terms.

As used herein, a quantity is "strictly decreasing" if said quantity decreases with any positive change in an underlying parameter, such as a distance from a particular point. In this case, said quantity is a strictly decreasing function of said underlying parameter in general mathematical terms.

As used herein, an element is "compositionally-graded" if a composition of said element is monotonically increasing or monotonically decreasing throughout said element and if said composition of said element is different at one end compared with said composition of said element at another end.

On one hand, the band gap of germanium is about one half of the band gap of silicon having a comparable phase. For example, crystalline germanium has a band gap of about 0.67 eV, and crystalline silicon has a band gap of about 1.10 eV. Hydrogenated amorphous germanium has a band gap from about 0.8 eV to about 0.9 eV, while hydrogenated amorphous silicon has a band gap from about 1.7 eV to about 1.8 eV. Because the open circuit voltage of a photovoltaic device employing a homogeneous semiconductor material including a p-n junction or a p-i-n junction is approximately proportional to the band gap of the homogeneous semiconductor material, a photovoltaic device employing silicon provides a greater open circuit voltage than a photovoltaic device employing germanium of the same crystalline quality.

On the other hand, short circuit current of a photovoltaic device tends to increase in a photovoltaic device employing a semiconductor material having a smaller band gap. For example, the absorption coefficient of germanium is about two orders of magnitude greater than the absorption coefficient of silicon. Thus, a thinner germanium layer can absorb the same energy from solar radiation as a significantly thicker silicon layer. Further, germanium has higher collection efficiency than silicon because germanium is capable of absorbing a wider range of solar spectrum than silicon having the same crystalline quality. For example, single crystalline germanium having a band gap of 0.67 eV can absorb solar spectrum with wavelength less than 1,852 nm, while single crystalline silicon having a band gap of 1.10 eV can absorb solar spectrum with wavelength less than 1,128 nm. Hydrogenated amorphous germanium having a band gap of 0.85 eV can absorb solar spectrum with wavelength less than 1,460 nm, while hydrogenated amorphous silicon having a band gap of 1.75 eV can absorb solar spectrum with wavelength less than 709 nm.

The higher open circuit voltage of silicon provides an advantage over the lower open circuit voltage of germanium, while the higher short circuit current of germanium provides an advantage over the lower short circuit current of silicon. Combining the advantageous characteristics of silicon and germanium, however, is not straightforward, and typically result in decompositionally-graded performance.

Figure 3:
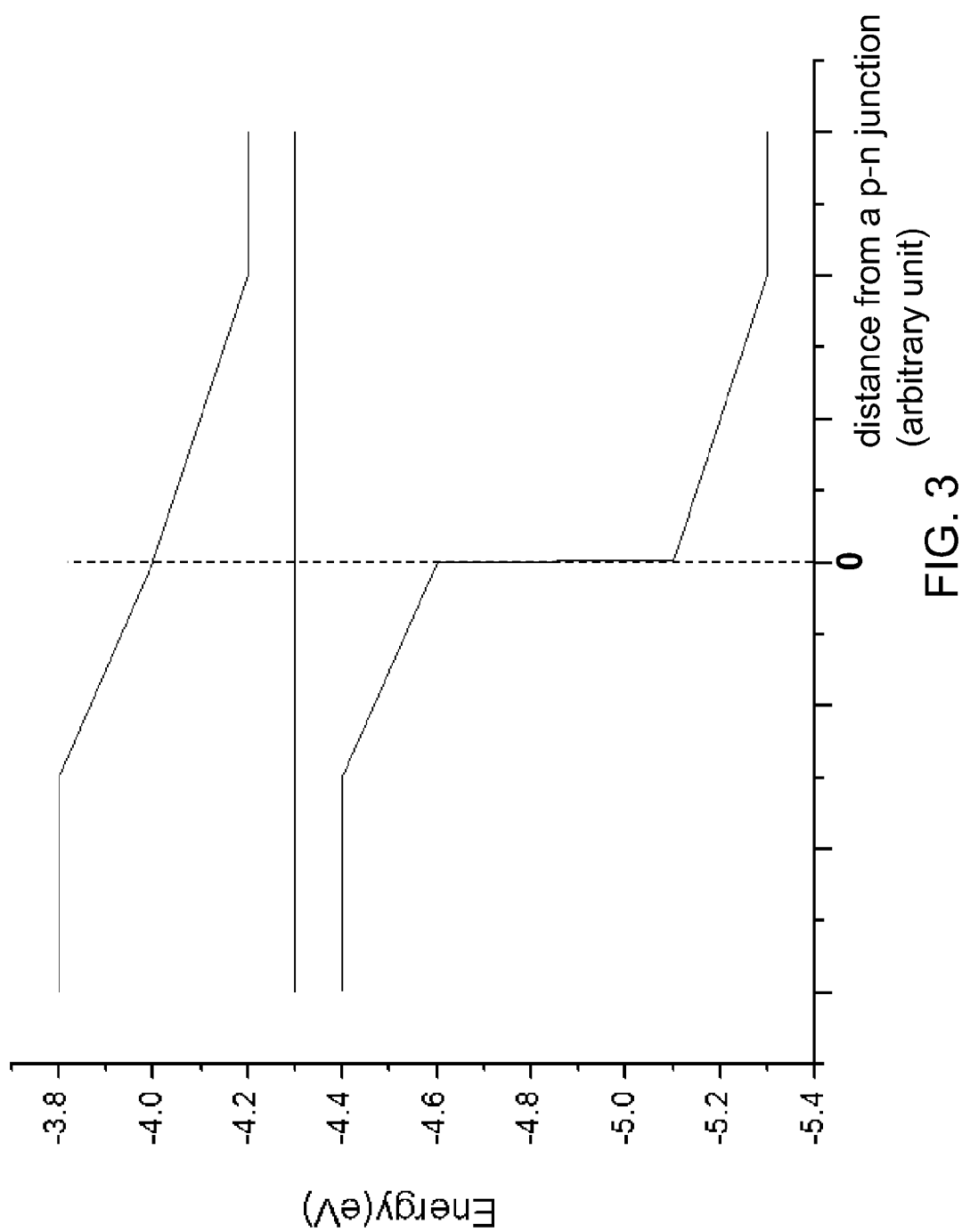
FIG. 3 is a band diagram of a first hypothetical semiconductor structure including a p-n junction between an n-doped first semiconductor material and a p-doped second semiconductor material in which the band gap of the n-doped first semiconductor material is greater than the band gap of the p-doped second semiconductor material.

Referring to FIG. 3, a band diagram is shown for a first hypothetical semiconductor structure, which includes a p-n junction between an n-doped first semiconductor material and a p-doped second semiconductor material. In the first hypothetical semiconductor structure, the first semiconductor material is single crystalline silicon and the second semiconductor material is single crystalline germanium. The vertical scale represents the energy level as measured from the vacuum level. The first semiconductor material has a greater band gap than the second semiconductor material.

The portion of the band diagram with negative x coordinates, i.e., the portion to the left of the point marked with "0," corresponds to a p-doped germanium region. The portion of the band diagram with positive x coordinates, i.e., the portion to the right of the point marked with "0," corresponds to an n-doped silicon region. Although the p-type dopant concentration is substantially constant in the p-doped germanium region, the p-n junction causes the valence band and the conduction band of the p-doped germanium region to bend downward near the p-n junction. The p-doped germanium region includes only germanium and electrical dopants, which are primarily p-type (except for insignificant quantity of n-type dopants near the p-n junction that are introduced into the p-doped germanium region by bulk diffusion). Although the n-type dopant concentration is substantially constant in the n-doped silicon region, the p-n junction causes the valence band and the conduction band of the n-doped silicon region to bend downward near the p-n junction. The n-doped silicon region includes only silicon and electrical dopants, which are primarily n-type (except for insignificant quantity of p-type dopants near the p-n junction that are introduced into the n-doped silicon region by bulk diffusion). The flat line around the energy level of −4.3 eV corresponds to the Fermi energy level in the first hypothetical semiconductor structure.

The open circuit voltage of the first hypothetical semiconductor structure is determined by the external voltage to flatten either of the valence band or the conduction band because flattening either band induces flow of electrical charges in the flattened band. Thus, the open circuit voltage of the first hypothetical semiconductor structure is approximately equal to the open circuit voltage of single crystalline germanium, i.e., the second semiconductor material. Consequently, the first hypothetical semiconductor structure does not provide the advantage of the open circuit voltage of the first semiconductor material, i.e., single crystalline silicon.

Figure 4:
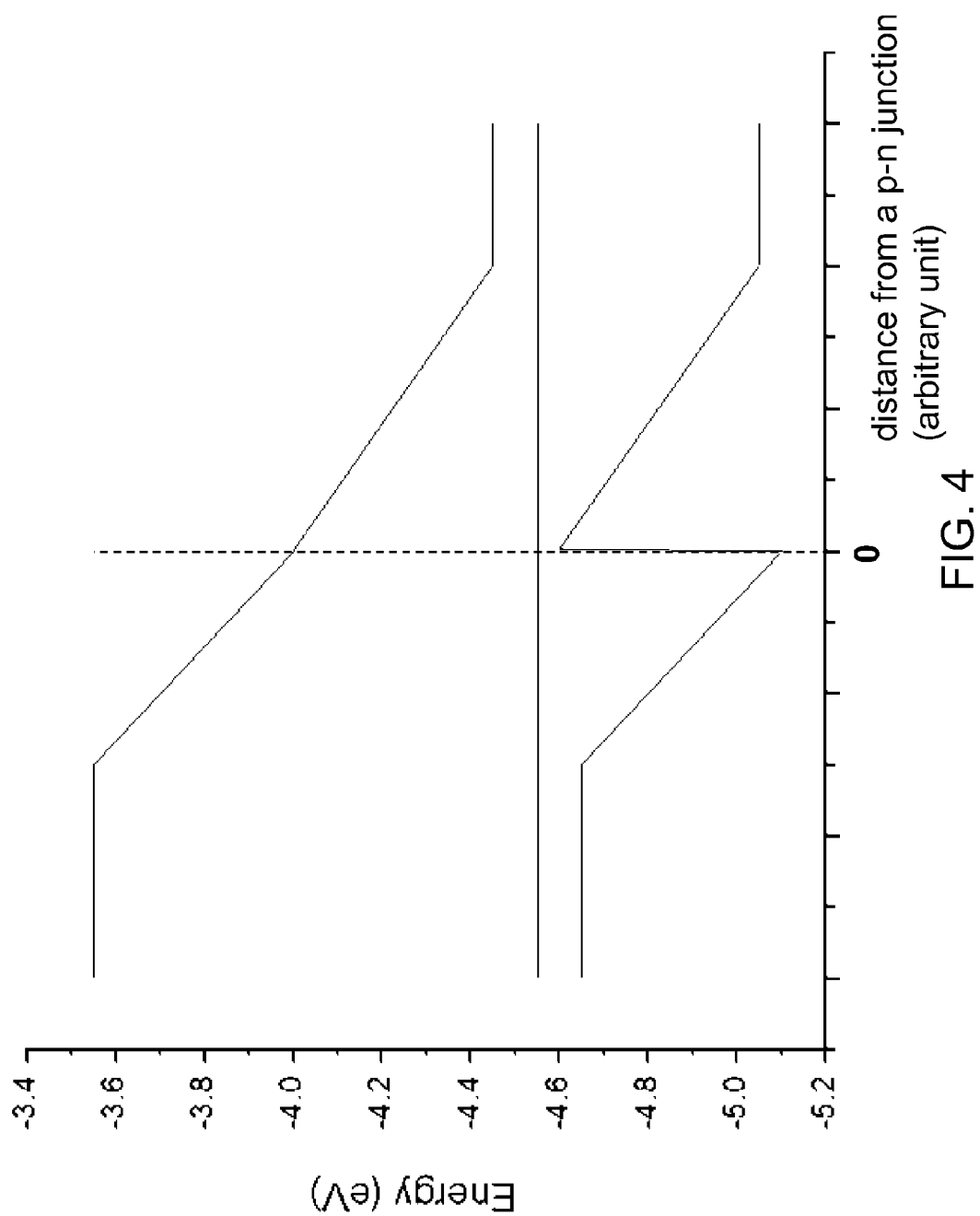
FIG. 4 is a band diagram of a second hypothetical semiconductor structure including a p-n junction between a p-doped first semiconductor material and an n-doped second semiconductor material in which the band gap of the p-doped first semiconductor material is greater than the band gap of the n-doped second semiconductor material.

Referring to FIG. 4, a band diagram is shown for a second hypothetical semiconductor structure, which includes a p-n junction between a p-doped first semiconductor material and an n-doped second semiconductor material. In the second hypothetical semiconductor structure, the first semiconductor material is single crystalline silicon and the second semiconductor material is single crystalline germanium. The vertical scale represents the energy level as measured from the vacuum level. The first semiconductor material has a greater band gap than the second semiconductor material.

The portion of the band diagram with negative x coordinates, i.e., the portion to the left of the point marked with "0," corresponds to a p-doped silicon region. The portion of the band diagram with positive x coordinates, i.e., the portion to the right of the point marked with "0," corresponds to an n-doped germanium region. Although the p-type dopant concentration is substantially constant in the p-doped silicon region, the p-n junction causes the valence band and the conduction band of the p-doped silicon region to bend downward near the p-n junction. The p-doped silicon region includes only silicon and electrical dopants, which are primarily p-type (except for insignificant quantity of n-type dopants near the p-n junction that are introduced into the p-doped silicon region by bulk diffusion). Although the n-type dopant concentration is substantially constant in the n-doped germanium region, the p-n junction causes the valence band and the conduction band of the n-doped germanium region to bend downward near the p-n junction. The n-doped germanium region includes only germanium and electrical dopants, which are primarily n-type (except for insignificant quantity of p-type dopants near the p-n junction that are introduced into the n-doped germanium region by bulk diffusion). The flat line around the energy level of −4.55 eV corresponds to the Fermi energy level in the first hypothetical semiconductor structure.

The open circuit voltage of the second hypothetical semiconductor structure is determined by the external voltage to flatten either of the valence band or the conduction band because flattening either band induces flow of electrical charges in the flattened band. The open circuit voltage of the second hypothetical semiconductor structure is approximately equal to the open circuit voltage of single crystalline germanium, i.e., the second semiconductor material. Consequently, the second hypothetical semiconductor structure does not provide the advantage of the open circuit voltage of the first semiconductor material, i.e., single crystalline silicon.

Figure 5:
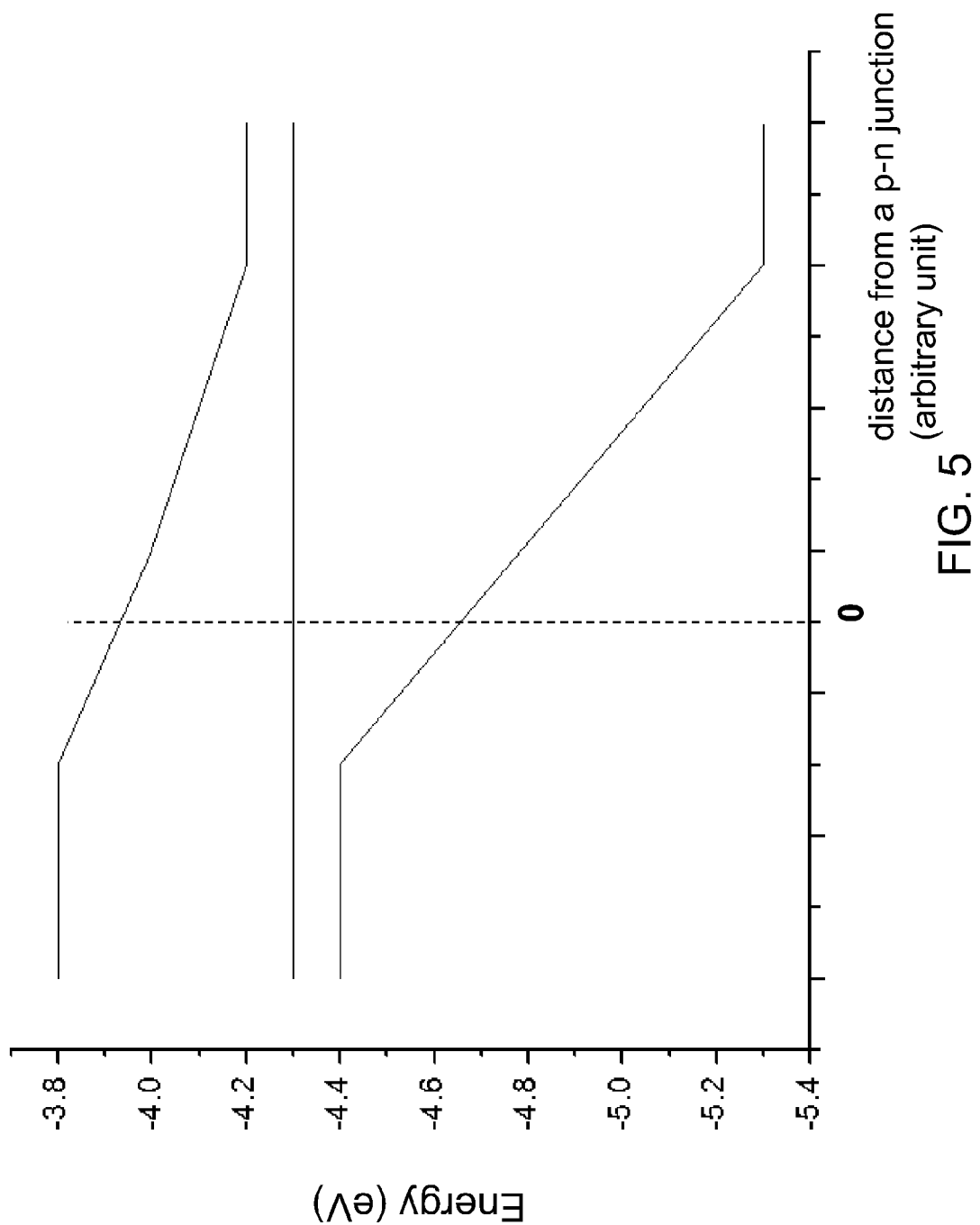
FIG. 5 is a band diagram of a third hypothetical semiconductor structure including a p-n junction within a compositionally-graded composition semiconductor layer located between an n-doped first semiconductor material layer and a p-doped second semiconductor material layer. The concentration of a first semiconductor material and a concentration of a second semiconductor material are complimentarily compositionally-graded. The band gap of the n-doped first semiconductor material is greater than the band gap of the p-doped second semiconductor material.

Referring to FIG. 5 a band diagram is shown for a third hypothetical semiconductor structure, which includes a p-n junction located in a compositionally-graded composition semiconductor layer. In the third hypothetical semiconductor structure, the first semiconductor material is single crystalline silicon and the second semiconductor material is single crystalline germanium. The vertical scale represents the energy level as measured from the vacuum level. The first semiconductor material has a greater band gap than the second semiconductor material.

The right side of the band diagram including a flat valence band portion and a flat conduction band portion corresponds to an n-doped silicon region. The left side of the band diagram including another flat valence band portion and another flat conduction band portion corresponds to a p-doped germanium region. The sloped portion of the band diagram corresponds to a compositionally-graded composition semiconductor layer including a p-n junction. In the portion of the compositionally-graded composition semiconductor region to the right of the p-n junction, the n-type dopant concentration is substantially constant, and can be the same as the n-type dopant concentration in the n-doped silicon region. In the portion of the compositionally-graded composition semiconductor region to the left of the p-n junction, the p-type dopant concentration is substantially constant, and can be the same as the p-type dopant concentration in the p-doped germanium region. Within the compositionally-graded semiconductor region, the concentration of germanium increases strictly with distance from the interface between the compositionally-graded semiconductor region and the n-doped silicon region.

The open circuit voltage of the third hypothetical semiconductor structure is determined by the external voltage to flatten either of the valence band or the conduction band because flattening either band induces flow of electrical charges in the flattened band. Thus, the open circuit voltage of the third hypothetical semiconductor structure is approximately equal to the open circuit voltage of single crystalline germanium, i.e., the second semiconductor material. Consequently, the third hypothetical semiconductor structure does not provide the advantage of the open circuit voltage of the first semiconductor material, i.e., single crystalline silicon.

Figure 6:
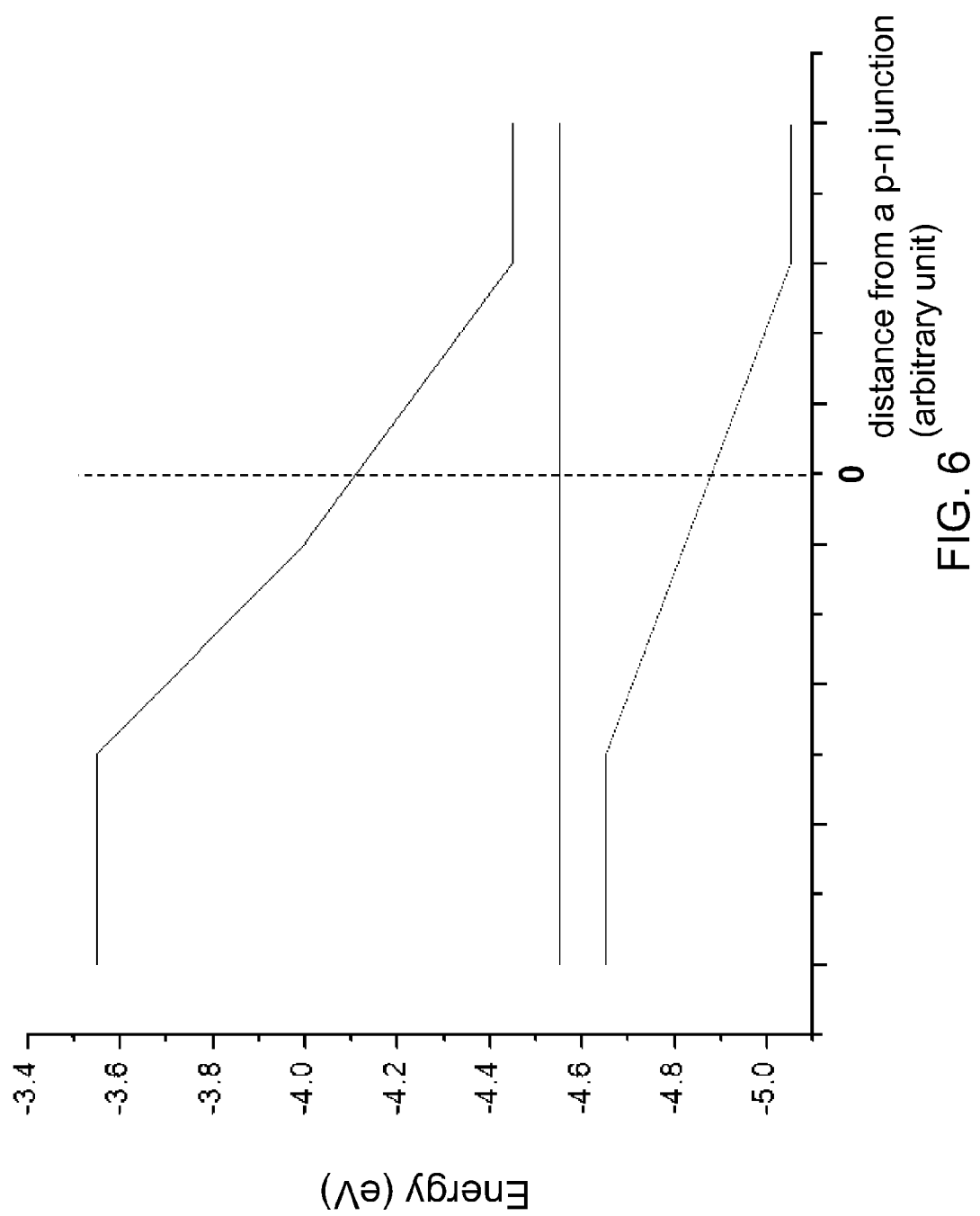
FIG. 6 is a band diagram of a fourth hypothetical semiconductor structure including a p-n junction within a compositionally-graded composition semiconductor layer located between a p-doped first semiconductor material layer and an n-doped second semiconductor material layer. The concentration of a first semiconductor material and a concentration of a second semiconductor material are complimentarily compositionally-graded. The band gap of the p-doped first semiconductor material is greater than the band gap of the n-doped second semiconductor material.

Referring to FIG. 6, a band diagram is shown for a fourth hypothetical semiconductor structure, which includes a p-n junction located in a compositionally-graded composition semiconductor layer. In the fourth hypothetical semiconductor structure, the first semiconductor material is single crystalline silicon and the second semiconductor material is single crystalline germanium. The vertical scale represents the energy level as measured from the vacuum level. The first semiconductor material has a greater band gap than the second semiconductor material.

The left side of the band diagram including a flat valence band portion and a flat conduction band portion corresponds to a p-doped silicon region. The right side of the band diagram including another flat valence band portion and another flat conduction band portion corresponds to an n-doped germanium region. The sloped portion of the band diagram corresponds to a compositionally-graded composition semiconductor layer including a p-n junction. In the portion of the compositionally-graded composition semiconductor region to the right of the p-n junction, the n-type dopant concentration is substantially constant, and can be the same as the n-type dopant concentration in the n-doped germanium region. In the portion of the compositionally-graded composition semiconductor region to the left of the p-n junction, the p-type dopant concentration is substantially constant, and can be the same as the p-type dopant concentration in the p-doped silicon region. Within the compositionally-graded semiconductor region, the concentration of germanium increases strictly with distance from the interface between the compositionally-graded semiconductor region and the p-doped silicon region.

The open circuit voltage of the fourth hypothetical semiconductor structure is determined by the external voltage to flatten either of the valence band or the conduction band because flattening either band induces flow of electrical charges in the flattened band. Thus, the open circuit voltage of the fourth hypothetical semiconductor structure is approximately equal to the open circuit voltage of single crystalline germanium, i.e., the second semiconductor material. Consequently, the fourth hypothetical semiconductor structure does not provide the advantage of the open circuit voltage of the first semiconductor material, i.e., single crystalline silicon.

Figure 7:
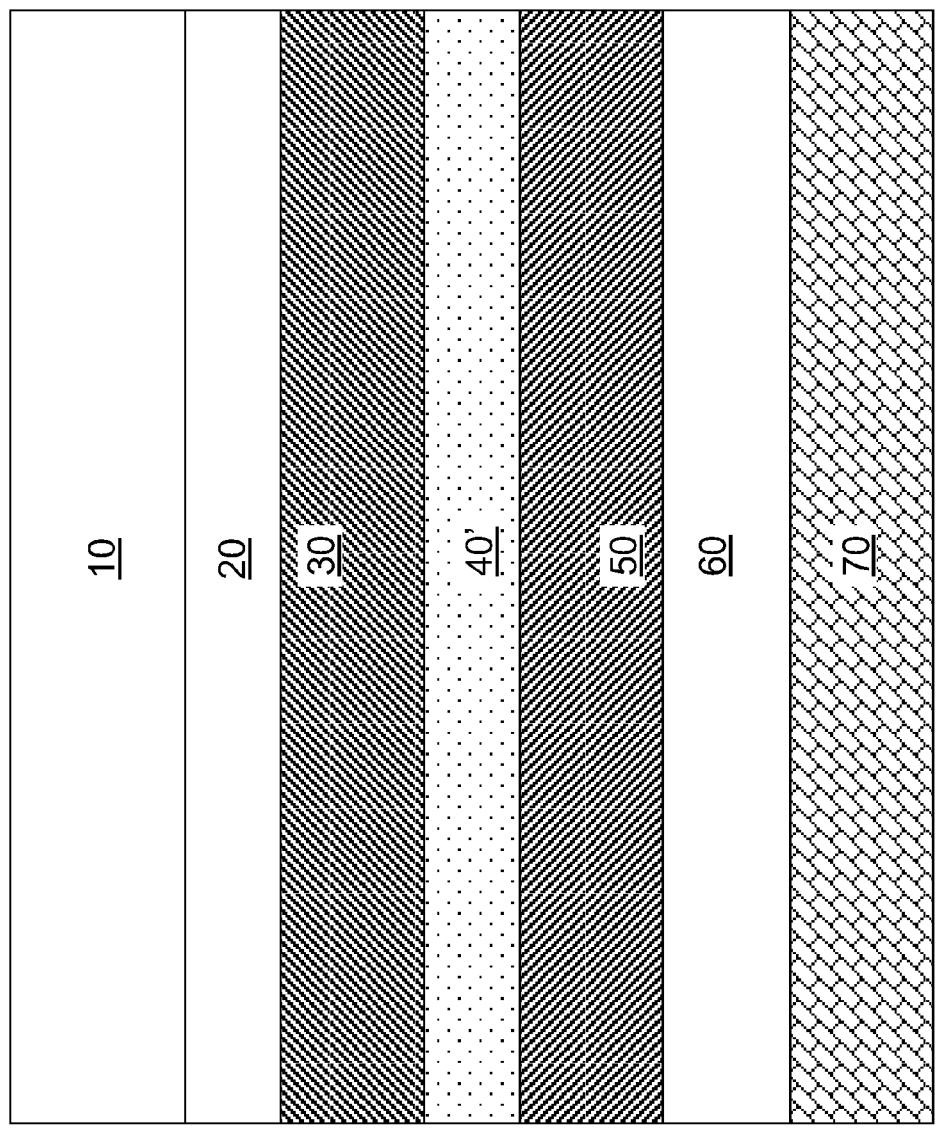
FIG. 7 is a vertical cross-sectional view of a fifth hypothetical semiconductor structure including a p-i-n junction. The fifth hypothetical semiconductor structure includes a first material junction between a p-doped first semiconductor material layer and an intrinsic second semiconductor material layer and a second material junction between the intrinsic semiconductor material layer and an n-doped semiconductor material layer.

Referring to FIG. 7, a fifth hypothetical semiconductor structure is a photovoltaic device structure, which incorporates some inventive features of the present disclosure, i.e., the features of compositionally-graded-doping regions located near a p-i interface and an i-n interface. Specifically, the fifth hypothetical semiconductor structure includes a stack, from top to bottom, of a substrate 10, a contact material layer 20, a p-doped first semiconductor material layer 30, an intrinsic second semiconductor material layer 40', an n-doped first semiconductor layer 50, a first back reflector layer 60, and a second back reflector layer 70. A first material junction is located between the p-doped first semiconductor material layer 30 and the intrinsic second semiconductor material layer 40'. A second material junction is located between the intrinsic second semiconductor material layer 40' and the n-doped first semiconductor layer 50.

The substrate 10 is a structure that provides mechanical support to the photovoltaic device structure, i.e., fifth hypothetical semiconductor structure. The substrate 10 may be transparent in the range of electromagnetic radiation at which photogeneration of electrons and holes occur within the photovoltaic device structure. If the photovoltaic device structure is a solar cell structure, the substrate 10 can be optically transparent. The substrate 10 can be a glass substrate. The thickness of the substrate 10 can be from 50 microns to 3 mm, although lesser and greater thicknesses can also be employed.

The contact material layer 20 includes a conductive material that provides electrical contact to the p-doped first semiconductor material layer 30. The contact material layer 20 can be a transparent conductive material layer that includes a material that is transparent in the range of electromagnetic radiation at which photogeneration of electrons and holes occur within the photovoltaic device structure. If the photovoltaic device structure is employed as a solar cell, the contact material layer 20 can be optically transparent. For example, the contact material layer 20 can include a transparent conductive oxide such as a fluorine-doped tin oxide ($SnO_2$:F), an aluminum-doped zinc oxide (ZnO:Al), or indium tin oxide. The thickness of the contact material layer 20 can be from 300 nm to 3 microns, although lesser and greater thicknesses can also be employed. The contact material layer 20 is electrically connected to the p-doped first semiconductor material layer 30.

The p-doped first semiconductor material layer 30 includes an amorphous, microcrystalline, or epitaxial p-doped first semiconductor-containing material. In some cases, the p-doped first semiconductor material layer 30 can include a hydrogenated amorphous or microcrystalline p-doped first semiconductor-containing material. The presence of hydrogen in the p-doped first semiconductor material layer 30 can increase the atomic concentration of free charge carriers, i.e., holes, by delocalizing the electrical charges that are pinned to defect sites. The first semiconductor material is selected in conjunction with a second semiconductor material such that the band gap of the first semiconductor material is greater than the band gap of the second semiconductor material. The dopant concentration of the p-type dopants can be constant throughout the p-doped first semiconductor material layer 30.

The intrinsic second semiconductor material layer 40' includes the second semiconductor material and does not include dopants. In one embodiment, the intrinsic second semiconductor material layer 40' can consist of the second semiconductor material. Thus, the valence band and the conduction band of the intrinsic second semiconductor material layer 40' are flat, and the Fermi level is located in the middle of the valence band and the conduction band in the intrinsic second semiconductor material layer 40'.

The n-doped first semiconductor material layer 50 includes an amorphous, microcrystalline, or epitaxial n-doped first semiconductor-containing material. In some cases, the n-doped first semiconductor material layer 50 can include a hydrogenated amorphous or microcrystalline n-doped first semiconductor-containing material. The presence of hydrogen in the n-doped first semiconductor material layer 50 can increase the atomic concentration of free charge carriers, i.e., holes, by delocalizing the electrical charges that are pinned to defect sites. The dopant concentration of the n-type dopants can be constant throughout the n-doped first semiconductor material layer 50.

Figure 8:
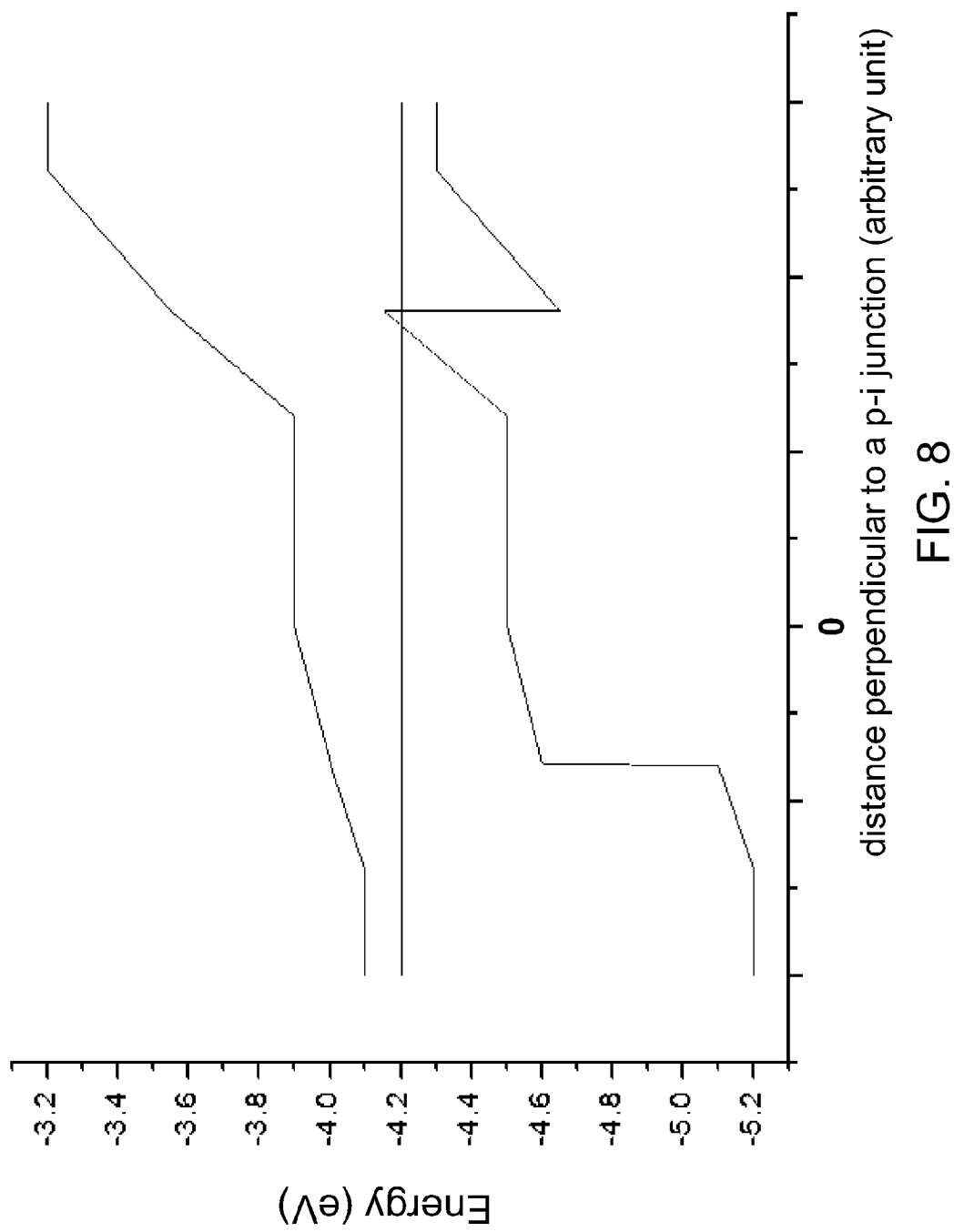
FIG. 8 is a band diagram of the fifth hypothetical semiconductor structure. An intrinsic semiconductor layer having a homogeneous composition including intrinsic germanium forms an interface with a p-doped silicon region on one side and another interface with an n-doped silicon region on the opposite side.

Referring to FIG. 8, a band diagram of the fifth hypothetical semiconductor structure is shown. The open circuit voltage of the fifth hypothetical semiconductor structure is affected by the external voltage to flatten either of the valence band or the conduction band. However, the bumps in the valence band or the conduction band reduce the open circuit voltage of the fifth hypothetical semiconductor structure. Thus, the open circuit voltage of the fifth hypothetical semiconductor structure does not significantly exceed the open circuit voltage of the second semiconductor material. In other words, the improvement in the open circuit voltage of the fifth hypothetical semiconductor structure relative a photovoltaic device employing a p-i-n junction in the second semiconductor material is limited due to the abrupt shifts in the energy level in the valence band or in the conduction band.

Figure 9:
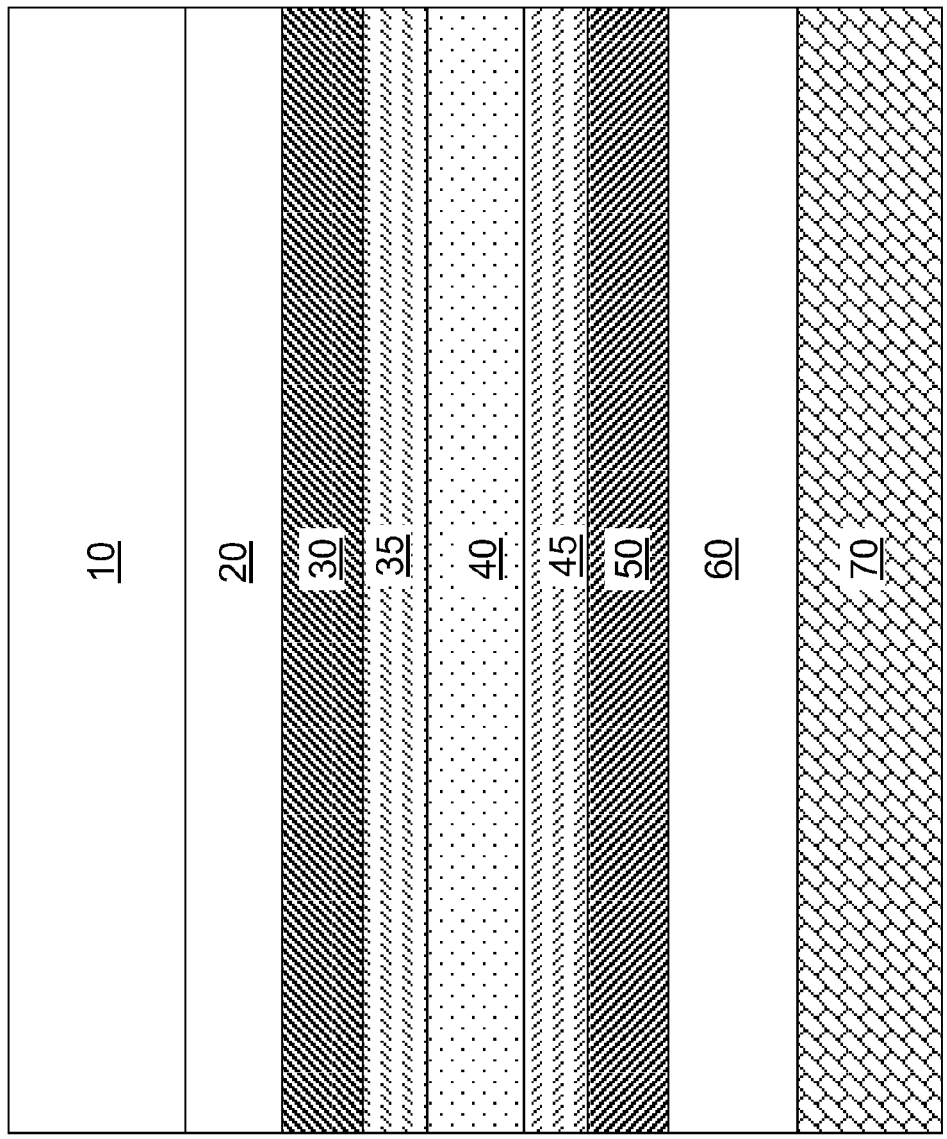

Referring to FIG. 9, an exemplary semiconductor structure according to the present disclosure further improves on the fifth hypothetical semiconductor structure by incorporating the feature of a compositionally-graded semiconductor material composition near a p-i interface and an i-n interface. The exemplary semiconductor structure is a photovoltaic device structure that may be employed as a solar cell structure. The intrinsic second semiconductor material layer 40' in the fifth hypothetical semiconductor structure is replaced with an intrinsic semiconductor material layer 40 in the exemplary semiconductor structure. The intrinsic semiconductor material layer 40 includes the second semiconductor material and does not include dopants. In the exemplary semiconductor structure according to the present disclosure, a first intrinsic compositionally-graded semiconductor layer 35, which includes a first compositionally-graded alloy of the first semiconductor material and the second semiconductor material, is present between a p-doped first semiconductor material layer 30 and an intrinsic second semiconductor material layer 40. Likewise, a second intrinsic compositionally-graded semiconductor layer 45, which includes a second compositionally-graded alloy of the first semiconductor material and the second semiconductor material, is present between an n-doped first semiconductor material layer 50 and the intrinsic second semiconductor material layer 40.

In one embodiment, the intrinsic semiconductor material layer 40 consists of the second semiconductor material. In this embodiment, the atomic percentage of the first semiconductor material in the first intrinsic compositionally-graded semiconductor layer 35 typically becomes zero at the interface with the intrinsic material layer 40, and the atomic percentage of the first semiconductor material in the second intrinsic compositionally-graded semiconductor layer 45 typically becomes zero at the interface with the intrinsic material layer 40.

In another embodiment, the intrinsic semiconductor material layer 40 includes a homogenous alloy of the first semiconductor material and the second semiconductor material. In this embodiment, the atomic percentage of the first semiconductor material in the first intrinsic compositionally-graded semiconductor layer 35 typically becomes the same as the atomic concentration of the first semiconductor material in the intrinsic semiconductor material layer 40 at the interface with the intrinsic semiconductor material layer 40. Likewise, the atomic percentage of the first semiconductor material in the second intrinsic compositionally-graded semiconductor layer 45 typically becomes the same as the atomic concentration of the first semiconductor material in the intrinsic semiconductor material layer 40 at the interface with the intrinsic material layer 40. The atomic concentration of the first semiconductor material in the intrinsic semiconductor material layer 40 can be from 0% to 99%, and typically from 0% to 50%, and preferably from 0% to 20%. The valence band and the conduction band of the intrinsic semiconductor material layer 40 are flat, and the Fermi level is located in the middle of the valence band and the conduction band in the intrinsic semiconductor material layer 40.

The material junctions between the first semiconductor material and the second semiconductor material in the fifth hypothetical semiconductor structure are removed in the exemplary semiconductor structure according to the present disclosure, and are replaced with a compositionally-graded composition layers in which the atomic concentration of the first semiconductor material and the second semiconductor material monotonically change complimentarily. In other words, the atomic composition of the first semiconductor material monotonically increases or decreases as the atomic composition of the second semiconductor material correspondingly monotonically decreases or increases. Preferably, the atomic concentration of the first semiconductor material and the second semiconductor material strictly change complimentarily. A p-i junction coincides with the material junction at the interface between the p-doped first semiconductor material layer 30 and the first intrinsic compositionally-graded semiconductor layer 35. An i-n junction coincides with the material junction at the interface between the second intrinsic compositionally-graded semiconductor layer 45 and the n-doped first semiconductor material layer 50.

The first intrinsic compositionally-graded semiconductor layer 35 includes an alloy of the first semiconductor material and the second semiconductor material having complimentarily compositionally-graded atomic concentrations of the first and second semiconductor materials. Within the first intrinsic compositionally-graded semiconductor layer 35, the atomic concentration of the second semiconductor material monotonically decreases with distance from the intrinsic second material layer 40. Preferably, the atomic concentration of the second semiconductor material strictly decreases with distance from the intrinsic second material layer 40 within the first intrinsic compositionally-graded semiconductor layer 35.

The second intrinsic compositionally-graded semiconductor layer 45 includes an alloy of the first semiconductor material and the second semiconductor material having complimentarily compositionally-graded atomic concentrations of the first and second semiconductor materials. Within the second intrinsic compositionally-graded semiconductor layer 45, the atomic concentration of the second semiconductor material monotonically decreases with distance from the intrinsic second material layer 40. Preferably, the atomic concentration of the second semiconductor material strictly decreases with distance from the intrinsic second material layer 40 within the second intrinsic compositionally-graded semiconductor layer 45.

Thus, the exemplary semiconductor structure is a photovoltaic device that includes a stack of the first intrinsic compositionally-graded semiconductor layer 35 including the first compositionally-graded alloy of the first semiconductor material and the second semiconductor material, the intrinsic semiconductor material layer 40 including at least the second semiconductor material, and the second intrinsic compositionally-graded semiconductor layer 45 including the second compositionally-graded alloy of the first semiconductor material and the second semiconductor material. The atomic concentration of the second semiconductor material monotonically decreases with distance from an interface with the intrinsic semiconductor layer 40 in the first compositionally-graded alloy and the second compositionally-graded alloy.

The first semiconductor material and the second semiconductor material are selected so that the first semiconductor material has a greater band gap width than the second semiconductor material. The first semiconductor material and the second semiconductor material can be selected from, but is not limited to, silicon, germanium, III-V compound semiconductor materials, II-VI compound semiconductor materials, or any other compound semiconductors known in the art. Each of the first semiconductor material and the second semiconductor material can be a single elemental semiconductor or a single compound semiconductor, an alloy of a plurality of elemental semiconductors, an alloy of a plurality of compound semiconductors, or an alloy of at least one elemental semiconductor and at least one compound semiconductor. For example, the first semiconductor material can be silicon and the second semiconductor material can be germanium.

The first compositionally-graded alloy in the first intrinsic compositionally-graded semiconductor layer 35, the second semiconductor material and/or the first semiconductor material in the intrinsic semiconductor material layer 40, and the second compositionally-graded alloy in the second intrinsic compositionally-graded semiconductor layer 45 can be amorphous, polycrystalline, or single crystalline, i.e., epitaxially aligned to one another. In one embodiment, the first compositionally-graded alloy, the semiconductor material(s) in the intrinsic semiconductor material layer 40, and the second compositionally-graded alloy may include hydrogenated amorphous semiconductor materials.

In one embodiment, the atomic concentration of the second semiconductor material strictly decreases with distance from the interface with the intrinsic semiconductor layer 40 in the first compositionally-graded alloy within the first intrinsic compositionally-graded semiconductor layer 35 and the second compositionally-graded alloy within the second intrinsic compositionally-graded semiconductor layer 45.

In one embodiment, the atomic concentration of the second semiconductor material can be 100% at a first interface between the first intrinsic compositionally-graded semiconductor layer 35 and the intrinsic semiconductor layer 40, and the atomic concentration of the second semiconductor material can be 100% at a second interface between the second intrinsic compositionally-graded semiconductor layer 45 and the intrinsic semiconductor layer 40. In this embodiment, the intrinsic semiconductor material layer 40 typically consists of the second semiconductor material.

In one embodiment, the atomic concentration of the second semiconductor material can be 0% at a first end surface of the first intrinsic compositionally-graded semiconductor layer 35, i.e., at an interface with the p-doped first semiconductor material layer 30. Likewise, the atomic concentration of the second semiconductor material can be 0% at a second end surface of the second intrinsic compositionally-graded semiconductor layer 45, i.e., at an interface with the n-doped first semiconductor material layer 50.

The p-doped first semiconductor material layer 30 typically consists of a p-doped first semiconductor material, i.e., the first semiconductor material and p-type dopants. The n-doped first semiconductor material layer 50 typically consists of an n-doped first semiconductor material, i.e., the first semiconductor material and n-type dopants.

The thickness of each layer in the exemplary semiconductor structure can be optimized for performance. For example, the thickness of the p-doped first semiconductor material layer 30 can be from 50 nm to 500 nm, the thickness of the first intrinsic compositionally-graded semiconductor layer 35 can be from 10 nm to 200 nm, the thickness of the intrinsic semiconductor material layer 40 can be from 10 nm to 400 nm, the thickness of the second intrinsic compositionally-graded semiconductor layer 45 can be from 10 nm to 200 nm, and the thickness of the n-doped first semiconductor material layer 50 can be from 50 nm to 500 nm, although lesser and greater thicknesses can also be employed.

The first back reflector layer 60 includes a transparent conductive material that is transparent in the range of electromagnetic radiation at which photogeneration of electrons and holes occur within the photovoltaic device structure. If the photovoltaic device structure is employed as a solar cell, the first back reflector layer 60 can be optically transparent. For example, the first back reflector layer 60 can include a transparent conductive oxide such as a fluorine-doped tin oxide ($SnO_2$:F), an aluminum-doped zinc oxide (ZnO:Al), or indium tin oxide. Since such transparent conductive oxide materials are n-type materials, the contact between the first back reflector layer 60 and the n-doped semiconductor layer 50 is Ohmic, and as such, the contact resistance between the first back reflector layer 60 and the n-doped semiconductor layer 50 is negligible. The thickness of the back reflector layer 60 can be from 25 nm to 250 nm, although lesser and greater thicknesses can also be employed.

The second back reflector layer 70 includes a metallic material. Preferably, the metallic material has a high reflectivity in the range of electromagnetic radiation at which photogeneration of electrons and holes occur within the photovoltaic device structure. The metallic material can include silver, aluminum, or an alloy thereof. The thickness of the second back reflector layer 70 can be from 100 nm to 1 micron, although lesser and greater thicknesses can also be employed.

The p-doped first semiconductor material layer 30 and the contact material layer 20 are electrically connected to the first intrinsic compositionally-graded semiconductor layer 35. The first back reflector layer 60 and the second back reflector layer 70 are electrically connected to the second intrinsic compositionally-graded semiconductor layer 45 and the n-doped first semiconductor material layer 50. The first back reflector layer 60 can be optically transparent, and the combination of the first and second back reflector layers (60, 70) reflect any photons that pass through the stack of the p-doped first semiconductor material layer 30, the intrinsic semiconductor layer 140, and the n-doped first semiconductor material layer 50 to enhance the efficiency of the prior art photovoltaic device.

Figure 10:
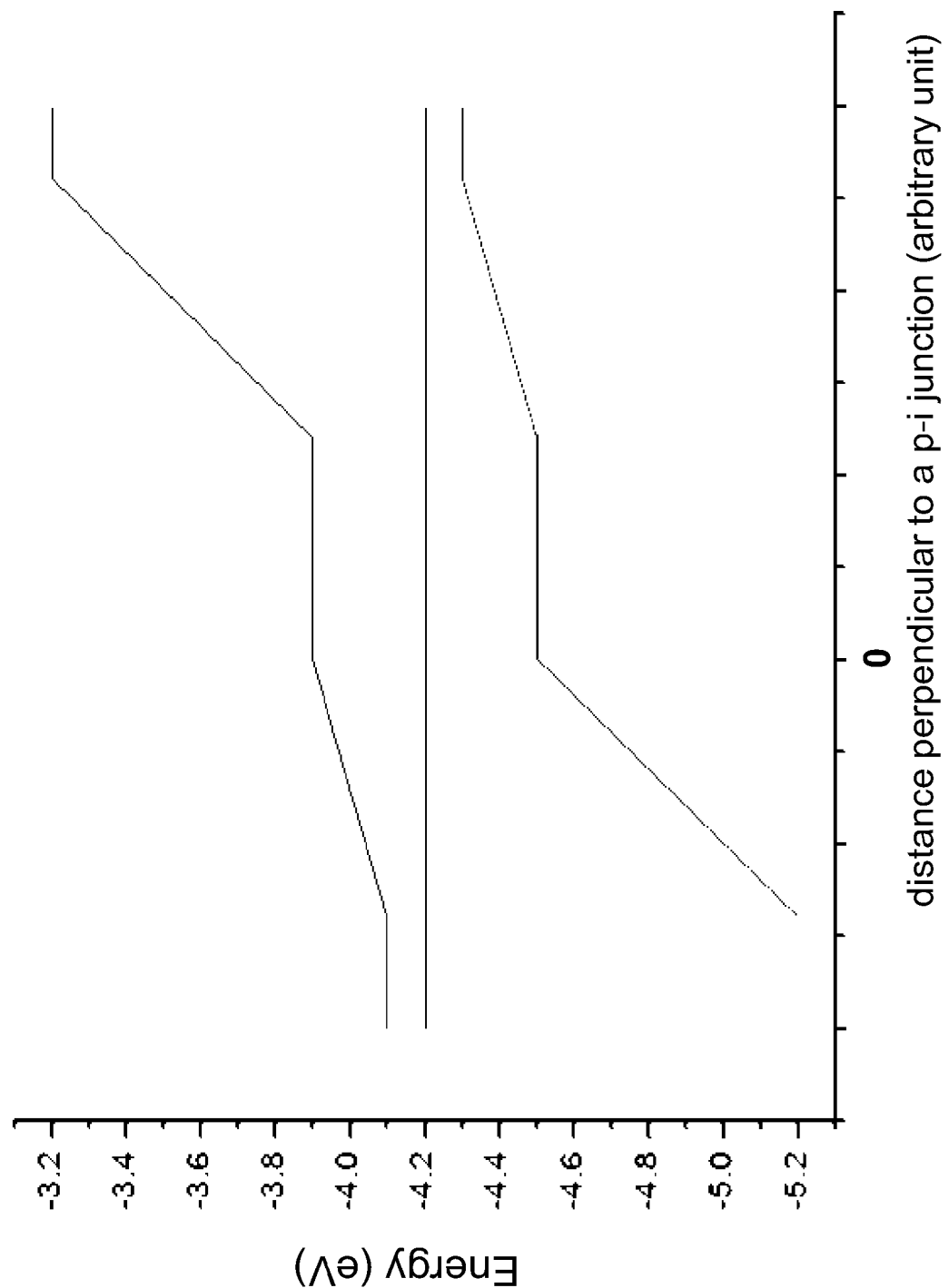
FIG. 10 is a band diagram for the exemplary semiconductor structure of FIG. 9. All band gap grading is effected by a grading of the composition of semiconductor materials, and is not affected by electrical dopants, i.e., p-type dopants or n-type dopants.

Referring to FIG. 10, a band diagram of the exemplary semiconductor structure is shown. The open circuit voltage of the exemplary semiconductor structure is determined by the external voltage to flatten either of the valence band or the conduction band. Because bumps in the valence band or the conduction band are eliminated in the exemplary semiconductor structure relative to the fifth hypothetical semiconductor structure, there is little loss in the open circuit voltage compared to the open circuit voltage of a homogeneous photovoltaic device employing the first semiconductor material and having a p-i-n junction or a p-n junction. Thus, the open circuit voltage of the exemplary semiconductor structure is essentially the same as the open circuit voltage of such a homogeneous photovoltaic device employing the first semiconductor material. At the same time, the short circuit current density is determined by the property of the material in the intrinsic semiconductor material layer 40, i.e., the property of the second semiconductor material if the intrinsic semiconductor material layer 40 consists of the second semiconductor material, or by the property of the alloy of the first and second semiconductor materials if the intrinsic semiconductor material layer 40 includes an alloy of the first and second semiconductor materials. Thus, the exemplary semiconductor structure can simultaneously provide the open circuit voltages obtainable from the first material and the short circuit current obtainable from the second material without suffering adverse effects.

Figure 11A:
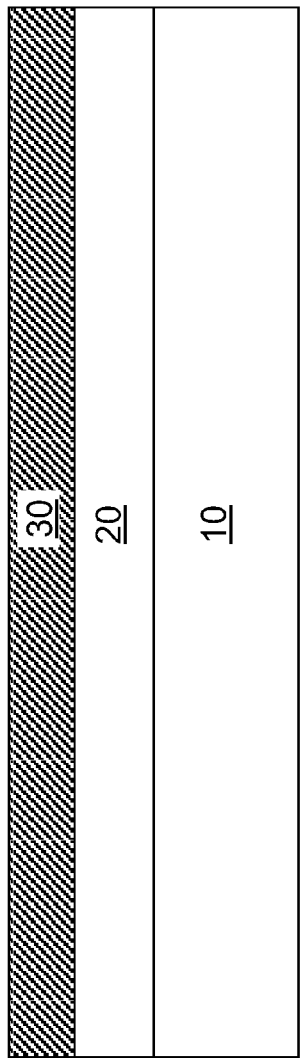
FIGS. 11A-11C are sequential vertical cross-sectional views of the exemplary semiconductor structure during various stages of a manufacturing process.
Figure 11B:
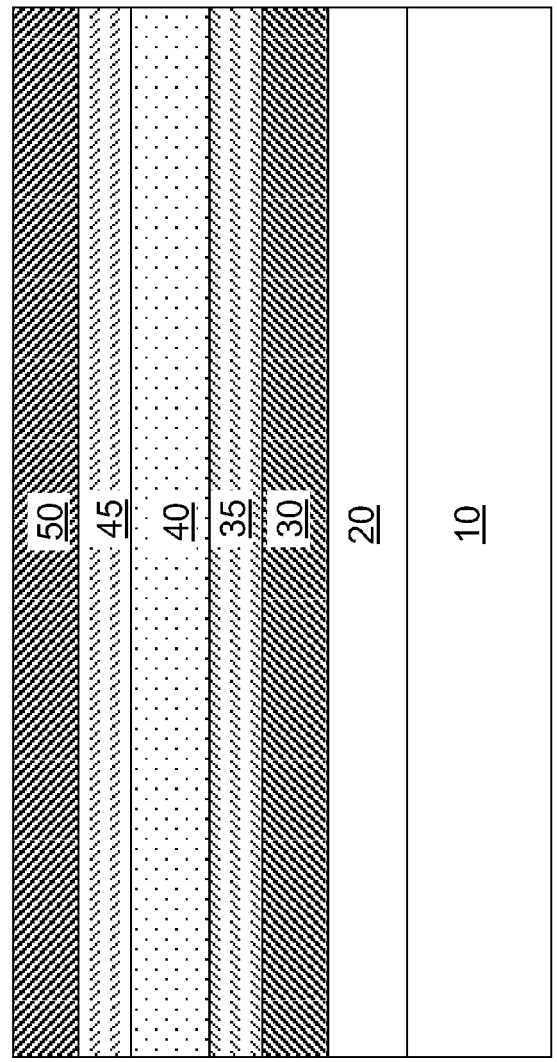
Figure 11C:
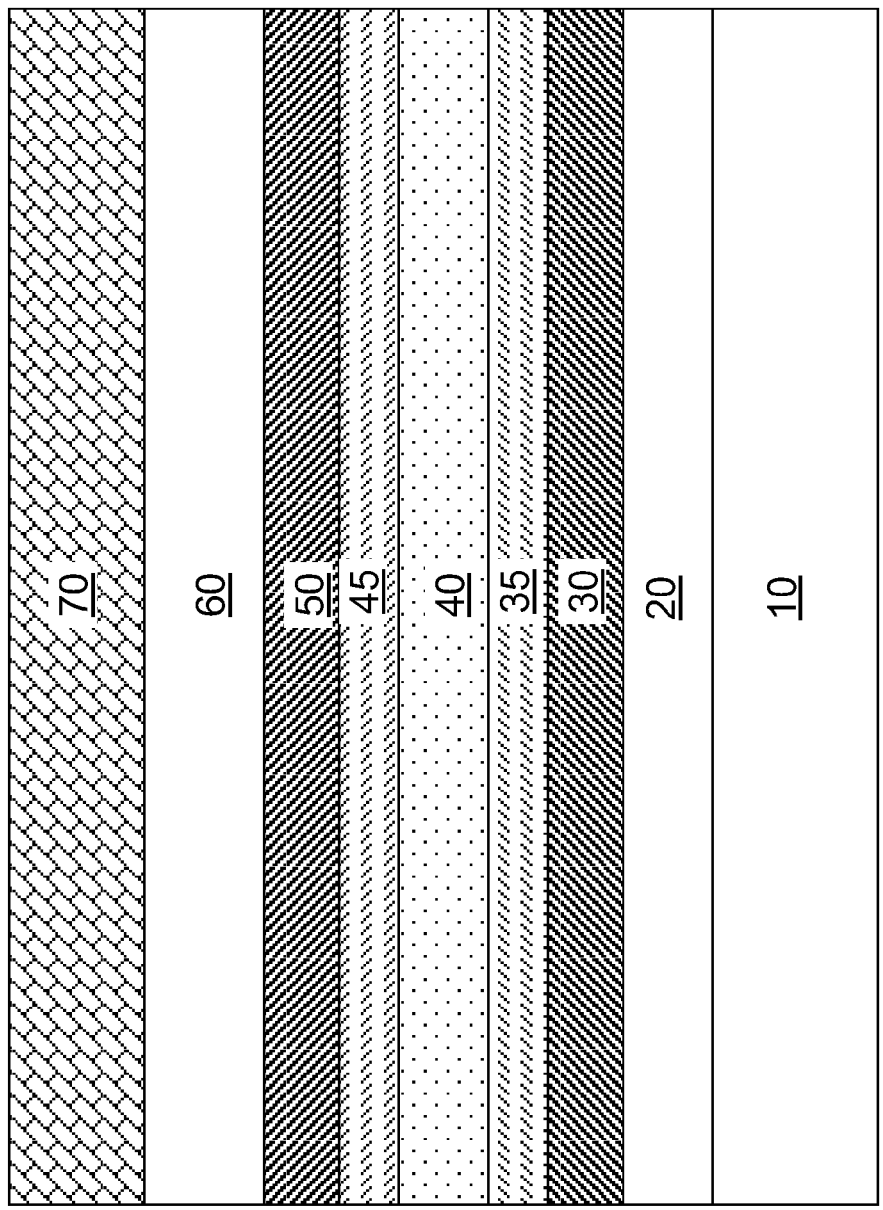

FIG. 11A-11C are sequential vertical cross-sectional views that illustrate a manufacturing process for forming the exemplary semiconductor structure of FIG. 9. Referring to FIG. 11A, the substrate 10 is provided, on which the contact material layer 20 is formed, for example, by deposition. In one embodiment, the substrate 20 includes a material that is transparent in the range of electromagnetic radiation at which photogeneration of electrons and holes occur within the photovoltaic structure as describe above. The contact material layer 20 can include, for example, a transparent conductive material layer.

The p-doped first semiconductor material layer 30 can be deposited, for example, by chemical vapor deposition (CVD) employing a first reactant including the first semiconductor material. P-type dopants can be introduced into the p-doped first semiconductor material layer 30, for example, by in-situ doping or by ex-situ doping such as ion implantation or plasma doping.

Referring to FIG. 11B, the first intrinsic compositionally-graded semiconductor layer 35 is deposited by introducing a second reactant including the second semiconductor material. The ratio of the flow rate of the second reactant to the flow rate of the first reactant monotonically increases, and preferably strictly increases, during the deposition of the first intrinsic compositionally-graded semiconductor layer 35. In case the intrinsic semiconductor material layer 40 consists of the second semiconductor material, the ratio can increase from zero to infinity, i.e., the composition of the reactant can gradually change from the first reactant to the second reactant. In case the intrinsic semiconductor material layer 40 includes an alloy of the first and second semiconductor materials, the ratio can increase from zero to a finite number during the deposition step.

The intrinsic semiconductor material layer 40 is deposited by maintaining the same gas flow as at the end of the deposition step for the first intrinsic compositionally-graded semiconductor layer 35. No dopant gas is flowed into the process chamber during deposition of the intrinsic semiconductor material layer 40. In case the intrinsic semiconductor material layer 40 consists of the second semiconductor material, only the second reactant is flowed into the process chamber during the deposition step for the intrinsic semiconductor material layer 40. In case the intrinsic semiconductor material layer 40 includes an alloy of the first and second semiconductor materials, a mixture of the first and second reactant gases are flowed into the process chamber.

The second intrinsic compositionally-graded semiconductor layer 45 is deposited by flowing a mixture of the first and second reactants such that the flow rate of the first reactant gradually increases during the deposition of the second intrinsic compositionally-graded semiconductor layer 45. The ratio of the flow rate of the second reactant to the flow rate of the first reactant monotonically decreases, and preferably strictly decreases, during the deposition of the second intrinsic compositionally-graded semiconductor layer 45. In one embodiment, only the first reactant flows at the end of this deposition step.

The n-doped first semiconductor material layer 50 can be deposited, for example, by chemical vapor deposition (CVD) employing a first reactant including the first semiconductor material. N-type dopants can be introduced into the n-doped first semiconductor material layer 50, for example, by in-situ doping or by ex-situ doping such as ion implantation or plasma doping.

In general, the deposition of the p-doped first semiconductor material layer 30, the first intrinsic compositionally-graded semiconductor layer 35, the intrinsic semiconductor material layer 40, the second intrinsic compositionally-graded semiconductor layer 45, and the n-doped first semiconductor material layer 50 can be effected in a process chamber configured to flow the first and second reactants and a carrier gas. The chemical vapor deposition process can be plasma enhanced chemical vapor process (PECVD) performed at a deposition temperature from 50° C. to 400° C., and preferably from 100° C. to 350° C., and at a pressure from 0.1 Torr to 10 Torr, and preferably from 0.2 Torr to 5 Torr.

Referring to FIG. 11C, the first back reflector layer 60 is deposited on the n-doped semiconductor layer 50 employing methods known in the art. The first back reflector layer 60 includes a transparent conductive material. The second back reflector layer 70 is subsequently deposited on the first back reflector layer 70, for example, by electroplating, electroless plating, physical vapor deposition, chemical vapor deposition, vacuum evaporation, or a combination thereof. The second back reflector layer 70 can be a metallic layer.

In a variation of the exemplary semiconductor structure, the doping types can be reversed, i.e., the p-type doped structures in the exemplary semiconductor structure can be substituted with n-type doped structures and the n-type doped structures in the exemplary semiconductor structure can be substituted with p-type doped structures in this variation. In general, therefore, a doped first semiconductor material layer having a doping of a first conductivity type is formed on the substrate 10. A first intrinsic compositionally-graded semiconductor layer is formed on the doped first semiconductor material layer. The first intrinsic compositionally-graded semiconductor layer has a doping of the first conductivity type. If the first conductivity type is p-type, the first intrinsic compositionally-graded semiconductor layer is the first intrinsic compositionally-graded semiconductor layer 35. If the first conductivity type is n-type, the first intrinsic compositionally-graded semiconductor layer is a second intrinsic compositionally-graded semiconductor layer, which is the same as the first intrinsic compositionally-graded semiconductor layer 35 except that all p-type dopants are replaced with n-type dopants.

An intrinsic semiconductor material layer 40 is formed on the first intrinsic compositionally-graded semiconductor layer. The intrinsic semiconductor material layer 40 including at least the second semiconductor material as discussed above. A second intrinsic compositionally-graded semiconductor layer is formed on the intrinsic semiconductor material layer 40. The second intrinsic compositionally-graded semiconductor layer has a doping of a second conductivity type, which is the opposite of the first conductivity type. For example, if the first conductivity type is p-type, the second conductivity type is n-type, and vice versa. If the first conductivity type is p-type, the second intrinsic compositionally-graded semiconductor layer is the second intrinsic compositionally-graded semiconductor layer 45. If the first conductivity type is n-type, the first intrinsic compositionally-graded semiconductor layer is a first intrinsic compositionally-graded semiconductor layer, which is the same as the second intrinsic compositionally-graded semiconductor layer 45 except that all n-type dopants are replaced with p-type dopants. A doped second semiconductor material layer having a doping of the second conductivity type is formed on the second intrinsic compositionally-graded semiconductor layer 45. The first back reflector layer 60 and the second back reflector layer 70 can be formed thereafter.

While the present disclosure has been particularly shown and described with respect to preferred embodiments thereof, it will be understood by those skilled in the art that the foregoing and other changes in forms and details can be made without departing from the spirit and scope of the present disclosure. It is therefore intended that the present disclosure not be limited to the exact forms and details described and illustrated, but fall within the scope of the appended claims.

What is claimed is:

1. A photovoltaic device comprising a stack, from top to bottom, of
    a first intrinsic compositionally-graded semiconductor layer including a first compositionally-graded alloy of silicon and germanium,
    an intrinsic semiconductor material layer having a thickness ranging from 10 nm to 400 nm and consisting of germanium formed directly on said first intrinsic compositionally-graded semiconductor layer, and
    a second intrinsic compositionally-graded semiconductor layer including a second compositionally-graded alloy of silicon and germanium formed directly on said intrinsic semiconductor material layer,
    wherein an atomic concentration of germanium decreases with distance from an interface between said intrinsic semiconductor layer and both said first intrinsic compositionally-graded alloy and said second intrinsic compositionally-graded alloy, and an atomic concentration of silicon increases with distance from the interface between said intrinsic semiconductor layer and both said first intrinsic compositionally-graded alloy and said second intrinsic compositionally-graded alloy.

2. The photovoltaic device of claim 1, wherein said first intrinsic compositionally-graded alloy, said intrinsic semiconductor material layer, and said second intrinsic compositionally-graded alloy are amorphous.

3. The photovoltaic device of claim 2, wherein said first intrinsic compositionally-graded alloy and said second intrinsic compositionally-graded alloy include hydrogenated amorphous silicon and germanium and said intrinsic semiconductor material layer consists of hydrogenated amorphous germanium.

4. The photovoltaic device of claim 1, wherein said first intrinsic compositionally-graded alloy, said intrinsic semiconductor material layer, and said second intrinsic compositionally-graded alloy are polycrystalline.

5. The photovoltaic device of claim 1, wherein said first intrinsic compositionally-graded alloy, said intrinsic semiconductor material layer, and said second intrinsic compositionally-graded alloy are single crystalline and epitaxially aligned to one another.

6. The photovoltaic device of claim 1, wherein said atomic concentration of germanium strictly decreases with distance from an interface between said intrinsic semiconductor layer and both said first intrinsic compositionally-graded alloy and said second intrinsic compositionally-graded alloy.

7. The photovoltaic device of claim 1, wherein said atomic concentration of germanium is 100% at a first interface between said first intrinsic compositionally-graded semiconductor layer and said intrinsic semiconductor layer, and said atomic concentration of germanium is 100% at a second interface between said second intrinsic compositionally-graded semiconductor layer and said intrinsic semiconductor layer.

8. The photovoltaic device of claim 7, wherein said atomic concentration of germanium is 0% at a first end surface of said first intrinsic compositionally-graded semiconductor layer, and said atomic concentration of germanium is 0% at a second end surface of said second intrinsic compositionally-graded semiconductor layer.

9. The photovoltaic device of claim 8, further comprising:
a p-doped first semiconductor material layer consisting of a p-doped first semiconductor material and located on said first end surface, and
an n-doped first semiconductor material layer consisting of an n-doped first semiconductor material and located on said second end surface.

10. The photovoltaic device of claim 9, wherein said first intrinsic compositionally-graded alloy and said second intrinsic compositionally-graded alloy include hydrogenated amorphous silicon and germanium and said intrinsic semiconductor material layer consists of hydrogenated amorphous germanium.

11. The photovoltaic device of claim 9, wherein a p-i junction is coincident with a material junction between said p-doped first semiconductor material layer and said first intrinsic compositionally-graded semiconductor layer.

12. The photovoltaic device of claim 11, wherein an i-n junction is coincident with a material junction between said n-doped first semiconductor material layer and said second intrinsic compositionally-graded semiconductor layer.

13. The photovoltaic device of claim 1, wherein said first intrinsic compositionally-graded semiconductor layer has a thickness from 10 nm to 200 nm, and said second intrinsic compositionally-graded semiconductor layer has a thickness from 10 nm to 200 nm.

14. The photovoltaic device of claim 1, further comprising;
a transparent conductive material layer electrically connected to said first intrinsic compositionally-graded semiconductor layer; and
at least one back reflector layer electrically connected to said second intrinsic compositionally-graded semiconductor layer.

15. A method of forming a photovoltaic device comprising:
forming a first intrinsic compositionally-graded semiconductor layer on a substrate, said first intrinsic compositionally-graded semiconductor layer including a first compositionally-graded alloy of silicon and germanium;
forming an intrinsic semiconductor material having a thickness ranging from 10 nm to 400 nm directly on said first intrinsic compositionally-graded semiconductor layer, said intrinsic semiconductor material layer consisting of germanium; and
forming a second intrinsic compositionally-graded semiconductor layer directly on said intrinsic semiconductor material layer, said second intrinsic compositionally graded semiconductor layer including a second compositionally-graded alloy of silicon and germanium,
wherein an atomic concentration of said germanium decreases with distance from an interface between said intrinsic semiconductor layer and both said first intrinsic compositionally-graded alloy and said second intrinsic compositionally-graded alloy, and an atomic concentration of said silicon increases with distance from the interface between said intrinsic semiconductor layer and both said first intrinsic compositionally-graded alloy and said second intrinsic compositionally graded alloy.

16. The method of claim 15, wherein said first intrinsic compositionally-graded alloy, said intrinsic semiconductor material layer, and said second intrinsic compositionally-graded alloy are amorphous.

17. The method of claim 15, wherein said atomic concentration of said germanium strictly decreases with distance from an interface between said intrinsic semiconductor layer and both said first intrinsic compositionally-graded alloy and said second intrinsic compositionally-graded alloy.

18. The method of claim 15, wherein said atomic concentration of said germanium is 100% at a first interface between said first intrinsic compositionally-graded semiconductor layer and said intrinsic semiconductor layer, and said atomic concentration of said germanium is 100 at a second interface between said second intrinsic compositionally-graded semiconductor layer and said intrinsic semiconductor layer.

19. The method of claim 15, further comprising:
forming a doped first semiconductor material layer consisting of a first semiconductor material and dopants of said first conductivity type on said substrate, and
forming another doped first semiconductor material layer consisting of said first semiconductor material and dopants of said second conductivity type on said second intrinsic compositionally-graded semiconductor layer,
wherein said second conductivity type is opposite the first conductivity type.

20. The method of claim 15, wherein said substrate is optically transparent, and said method further comprises;
forming a transparent conductive material layer on said substrate; and
forming at least one back reflector layer on said second intrinsic compositionally-graded semiconductor layer.

* * * * *